(12) United States Patent
Diedrichs

(10) Patent No.: US 11,081,886 B2
(45) Date of Patent: Aug. 3, 2021

(54) METHOD FOR DETECTING FORMATION OF A SEPARATE SYSTEM

(71) Applicant: Wobben Properties GmbH, Aurich (DE)

(72) Inventor: Volker Diedrichs, Wardenburg (DE)

(73) Assignee: Wobben Properties GmbH, Aurich (DE)

( * ) Notice: Subject to any disclaimer, the term of this patent is extended or adjusted under 35 U.S.C. 154(b) by 0 days.

(21) Appl. No.: 16/607,675

(22) PCT Filed: Apr. 24, 2018

(86) PCT No.: PCT/EP2018/060441
§ 371 (c)(1),
(2) Date: Oct. 23, 2019

(87) PCT Pub. No.: WO2018/197468
PCT Pub. Date: Nov. 1, 2018

(65) Prior Publication Data
US 2020/0191840 A1 Jun. 18, 2020

(30) Foreign Application Priority Data
Apr. 24, 2017 (DE) ..................... 10 2017 108 637.4

(51) Int. Cl.
*H02J 3/38* (2006.01)
*G01R 19/25* (2006.01)
(Continued)

(52) U.S. Cl.
CPC ............ *H02J 3/38* (2013.01); *G01R 19/2513* (2013.01); *G01R 31/3277* (2013.01); *F03D 7/0284* (2013.01); *H02J 2300/28* (2020.01)

(58) Field of Classification Search
CPC ... G01R 19/2513; G01R 31/3277; H02J 3/38; H02J 2300/28; H02J 3/386
See application file for complete search history.

(56) References Cited

U.S. PATENT DOCUMENTS 5,111,377 A 5/1992 Higasa et al.
5,493,485 A 2/1996 Okado
(Continued)

FOREIGN PATENT DOCUMENTS

DE 19503180 A1 8/1995
DE 69115081 T2 9/1996
(Continued)

*Primary Examiner* — Carlos Amaya
(74) *Attorney, Agent, or Firm* — Seed IP Law Group LLP

(57) ABSTRACT

A method for controlling a generating unit that feeds into an electrical supply system. The generating unit feeds into the electrical supply system using one or more converters or inverters. The method is provided for the purpose of detecting a system separation or formation of a separate system, and the method includes controlling the feed by a feed controller operating with at least one current controller, detecting at least one current control error and testing the detected current control error for a disparity from a predetermined reference range. The method includes identifying a system separation involving a separate system that is disconnected from the electrical supply system and to which the generating unit is connected if a disparity from the predetermined reference range has been detected.

16 Claims, 4 Drawing Sheets

(51) Int. Cl.
*G01R 31/327* (2006.01)
*F03D 7/02* (2006.01)

(56) References Cited

U.S. PATENT DOCUMENTS

| | | | |
|---|---|---|---|
| 7,948,102 B2 | 5/2011 | Schubert et al. | |
| 2010/0276930 A1* | 11/2010 | Fortmann | F03D 9/257 |
| | | | 290/44 |
| 2011/0115301 A1 | 5/2011 | Bhavaraju et al. | |
| 2012/0104756 A1 | 5/2012 | Beekmann et al. | |
| 2013/0076134 A1 | 3/2013 | Smith et al. | |
| 2014/0152331 A1* | 6/2014 | Wagoner | G01R 27/16 |
| | | | 324/705 |
| 2014/0307488 A1 | 10/2014 | Brogan et al. | |
| 2015/0069836 A1 | 3/2015 | Beekmann | |
| 2015/0311696 A1* | 10/2015 | Zhu | H02H 7/06 |
| | | | 361/21 |

FOREIGN PATENT DOCUMENTS

| | | |
|---|---|---|
| DE | 102004059100 A1 | 6/2006 |
| DE | 102008017715 A1 | 10/2009 |
| DE | 102010032822 A1 | 10/2011 |
| DE | 102014104287 A1 | 10/2014 |
| EP | 0444666 A2 | 9/1991 |
| EP | 0576271 A2 | 12/1993 |
| JP | 2001-320834 A | 11/2001 |
| JP | 2006254659 A | 9/2006 |
| JP | 2007-135256 A | 5/2007 |
| JP | 2012075245 A | 4/2012 |
| RU | 2516381 C2 | 5/2014 |
| RU | 2597235 C2 | 9/2016 |
| WO | 2017009608 A1 | 1/2017 |

\* cited by examiner

METHOD FOR DETECTING FORMATION OF A SEPARATE SYSTEM

BACKGROUND

Technical Field

The present invention relates to a method for controlling a generation unit feeding an electrical supply network, in particular a method for controlling such a wind power installation. The present invention also relates to such a generation unit, in particular such a wind power installation. In addition, the present invention relates to a wind farm having at least one such wind power installation.

Description of the Related Art

Wind power installations are known and are nowadays often combined in a wind farm, with the result that many wind power installations, for example 50 or 100, feed an electrical supply network at a network connection point. It is often even the case that remote wind farms are additionally connected to the electrical supply network via a comparatively long spur line.

Such wind farms and the corresponding supply networks are provided with different protective devices. In the electrical supply network in particular, which may be the European interconnected grid for example, isolating switches may be provided in order to electrically isolate parts or sections of the electrical supply network. Isolation of a wind farm mentioned also comes into consideration here. In this case, such isolation can be carried out at very different locations. With regard to the wind farm, isolation can be carried out in the region of the network connection point and, if a long spur line described is present, can also be carried out at the end or start of this spur line, for example. The situation in which isolation is carried out, during which a plurality of wind farms or else any other decentralized feeders, for example solar installations, are affected, also comes into consideration. It is therefore considered, for example, that isolation is carried out, after which a section is isolated from the rest of the electrical supply network and this isolated section still contains generation units which are connected to one another. This section may comprise, for example, a plurality of wind farms and solar installations which are electrically connected to one another. However, it is also considered that only an individual wind farm is isolated from a part of the electrical supply network.

In any case, the regions which are isolated by the isolation can be referred to as separate networks. The isolation process with the result of isolation is referred to as the formation of a separate network.

In this case, there are various ways of forming a separate network. One way of forming a separate network is for the isolated separate network to comprise only generation units which do not have any directly coupled synchronous generators, that is to say do not have any conventional large power plants. Such formation of a separate network or the relevant separate network is referred to as a separate network of type A here. This way of forming a separate network or this separate network is also distinguished by the fact that no additional significant loads are present or operated in this isolated part. Any wind power installation naturally also comprises loads, for example for operating a process computer. However, in this described formation of a separate network to form a separate network of type A, there are no loads in the isolated part which are not part of the generation units. The examples described above also relate to such formation of a separate network of type A.

The present invention does not relate to further possible formations of separate networks in which significant loads are present in the isolated part, for example, and which can be referred to as a separate network of type B or in which at least one large power plant is also additionally present and the isolated part is moreover so large and comprises different users that it could continue to be operated independently and can be referred to as fragmentation.

If such formation of the separate network of type A occurs, it is useful for the wind power installations and other generators in this separate network to reduce their power, in particular to reduce their power to zero, because this power can no longer be fed into the rest of the supply network and there are also no loads for removing the power. However, the problem here is that such isolation cannot be readily identified. Isolation by means of a network circuit breaker or another circuit breaker, in particular, can be regularly carried out without any prior notice or without any warning signal or any other indication. It is also regularly the case here that a wind farm, in particular, or even a wind power installation neither controls nor monitors the corresponding isolating switch. Even if a central wind farm controller were to monitor such an isolating switch, there would then also be the problem of quickly forwarding such knowledge to the wind power installations in the farm.

The installation of a sensor for identifying whether or not an isolating switch carries out isolation might also already be problematic because many different isolating switches are present at different locations and it is not possible to predict which isolating switch will carry out isolation. In addition, such effort would also be very high.

The German Patent and Trademark Office carried out a search in respect of the following prior art in the priority application for the present application: DE 195 03 180 A1, DE 10 2008 017 715 A1, DE 10 2014 104 287 A1, DE 691 15 081 T2, US 2013/0076134 A1, U.S. Pat. No. 5,493,485 A and WO 2017/009608 A1.

BRIEF SUMMARY

Provided is a method for identifying the formation of a separate network as quickly and as reliably as possible.

Provided is a method according to which at least one generation unit feeding an electrical supply network is controlled. In particular, such a generation unit is a wind power installation. In this case, this generation unit feeds the electrical supply network by means of one or more converters or inverters. In this case, a converter is a device which uses an alternating current or an AC voltage at one frequency to generate an alternating current or an AC voltage at another frequency. An inverter uses a direct current or a DC voltage to generate an alternating current or an AC voltage at the desired frequency. An inverter may be part of a converter. The decisive factor is that an alternating current or an AC voltage at a predefinable frequency is generated and, in this respect, all of the following explanations for a converter analogously also apply to an inverter and vice versa.

It is particularly important that the generation unit does not feed in power by means of a synchronous generator directly coupled to the supply network, but rather by means of the converter or inverter.

The method is therefore provided for the purpose of detecting network isolation or the formation of a separate network. The formation of a separate network, in particular, is the result of network isolation because a separate network is formed as a result of the network isolation. The proposed method comprises at least the following steps. The feed is first of all controlled by means of a feed controller. The feed controller operates with at least current control. The current is therefore detected and is fed back for the purpose of controlling the feed and therefore setting the current. Current control in the sense of control technology which comprises at least one control loop is therefore used.

It is then also proposed that at least one current control deviation of the control device is detected. Said current control therefore comprises the fact that a current control deviation is present, namely particularly a deviation between a desired current value and a detected actual current value. This current control deviation is therefore part of the current control, but is additionally detected or processed further and evaluated here for the purpose of detecting network isolation or the formation of a separate network.

A check is also carried out in order to determine whether the detected current control deviation has a deviation from a predetermined reference range. Such a reference range can therefore be predetermined or predefined and describes a range in which the current control deviations can lie. This range describes, in particular, a range in which the current control deviations lie if they are operated in a typical non-separate-network behavior.

Current control deviations naturally occur and are an essential part of the current control. The current control attempts to correct the current control deviations, as is conventional for a control process.

However, it has been identified that the current control deviations can additionally provide information relating to an operating point or operating range of the feed controller and therefore of the generation unit, in particular the wind power installation. In this case, the fundamental behavior of the generation unit and also of the feed controller and, in particular, of their current control is known. The range in which the current control deviation usually lies, that is to say the range in which it lies if there is no network isolation or the formation of a separate network, is known, in particular. Accordingly, this known range can be predefined or predetermined as the reference range.

For this purpose, a check is now carried out in order to determine whether the detected current control deviations leave this reference range, that is to say whether the current control deviation differs from a predetermined reference range, that is to say is outside such a reference range.

Network isolation, during which a separate network which is isolated from the electrical supply network is produced, is then identified if a deviation from the predetermined reference range has been detected. In this case, the formation of a separate network or network isolation is naturally identified only if the corresponding generation unit is also connected to this separate network which has been produced by the identified network isolation or the formation of a separate network.

The separate network particularly preferably is a network to which only the generation unit and one or more further generation units are connected and to which, in particular, no further generation units with a directly coupled synchronous generator are connected. No conventional large power plants are therefore also connected to the separate network in question.

The invention also proposes a method for controlling a generation unit feeding an electrical supply network. The generation unit feeds the electrical supply network by means of one or more converters or inverters, and wherein the method identifies network isolation, in the case of which a separate network which is isolated from the electrical supply network and to which the generation unit is connected is produced, wherein the method distinguishes between a first-degree separate network fault and the presence of a second-degree separate network fault, and a check is first carried out for identification of a first-degree separate network fault, and after a first-degree separate network fault has been identified, the presence of a second-degree separate network fault is checked.

The method can therefore identify network isolation or the formation of a separate network and this can be carried out, for example, in the manner already explained according to at least one embodiment described above. In this case too, a generation unit which uses one or more converters or inverters for feeding is used as the generation unit. In particular, the use of a wind power installation as a generation unit is also proposed here.

This method distinguishes between a first-degree separate network fault and a second-degree separate network fault. Accordingly, a second-degree separate network fault is a more serious fault. The second-degree separate network fault is, in particular, more serious than a first-degree separate network fault insofar as it constitutes a risk for the generation unit, in particular its converters or inverters. In this respect, the second-degree separate network fault can also produce a risk for other parts of the isolated separate network.

In this respect, it is therefore proposed to initially check for identification of a first-degree separate network fault. In particular, it is also proposed to react to such an identified first-degree separate network fault using control technology, which is also explained below according to further embodiments.

If a first-degree separate network fault has now been identified, it is proposed, as a further step, to check for the presence of a second-degree separate network fault. In this respect, a two-stage check is proposed, namely first of all for the first-degree separate network fault. If such a fault is not present, there is also no need to check for a second-degree separate network fault.

A first-degree separate network fault is preferably carried out using a method described according to at least one embodiment above.

Furthermore, according to one embodiment, it is proposed that, if the first-degree separate network fault is identified, a current value, for which the current control deviation is detected, is set to zero. This first-degree separate network fault is therefore reacted to here specifically and, in particular, immediately, that is to say as quickly as possible. The reaction is also at least such that the current output of the relevant generation unit is intended to be controlled to zero. The generation unit therefore remains electrically connected, for example remains electrically connected to a wind farm network, but receives the value zero as the desired current value. Provision is therefore made for the relevant current, that is to say, in particular, the output current of the generation unit, to be controlled to the value zero.

This exceptional situation of network isolation or the formation of a separate network was therefore initially reacted to quickly and in an appropriate manner at least as an immediate measure. In this case, a first-degree separate network fault is initially present. However, it was identified that, despite this reaction to the formation of a separate network, an even greater exceptional situation may be present, namely a second-degree separate network fault. In this respect, a second-degree separate network fault is even more rare and also more critical than the first-degree separate network fault. In particular, a second-degree separate network fault may be distinguished by the fact that an undesirable current occurs in the separate network, in particular also occurs at the output of the relevant generation unit, that is to say occurs, in particular, at the output of a wind power installation or its converters or inverters. Such a current therefore occurs here even though the desired value of the output current has been set to zero and an actual current of the value zero can also be assumed, in this respect, in the case of functioning control. A cause of such a current may be that further generators in the resulting separate network continue to feed in current.

It is now proposed that, when such a second-degree separate network fault has been identified after a first-degree separate network fault, a circuit breaker is opened and interrupts a current on which the current control deviation is based. This involves the output current, in particular, and, if such a second-degree separate network fault has been identified, it is proposed to interrupt the output current by means of a corresponding circuit breaker.

It was identified here, in particular, that, if there is initially formation of a separate network, if a first-degree separate network fault can still be assumed, the relevant generation unit initially remains connected and there is only control to the current value zero. It can therefore be ensured that the generation unit can also be immediately ready to feed in power again, in particular if the formation of a separate network which has occurred is ended. This may be particularly important in order to support the network which possibly also resulted in the formation of a separate network on account of a network problem. Actual isolation of the generation unit is carried out only if this attempt fails and a second-degree separate network fault has been identified.

One embodiment proposes that, in order to check the detected current control deviation for a deviation from a predetermined reference range, a checking variable or checking function is determined from the current control deviation. For example, the absolute value of the current deviation can be used as the checking variable, to name a very simple example. However, the consideration of the dynamic response also comes into consideration, with the result that a rise in the control deviation per unit time is used as the checking variable, for example. Additionally or alternatively, a plurality of values can be recorded, in particular in chronological order, and can be taken as a basis as the checking function. However, the practice of considering a transformation of the control deviation or a control deviation of a transformed current as the checking variable or checking function also comes into consideration.

In a manner matched to this, a reference variable or reference function is formed and is compared with the checking variable or checking function. In the simplest case, an upper limit for the absolute value of a control deviation can be stipulated. This upper limit is then the reference variable and the absolute value of the detected control deviation is the checking variable. If this absolute value exceeds the limit value, it is then assumed that there is a deviation from the predetermined reference range.

However, profiles can also be taken as a basis here as the reference function. For example, situations may arise in which there is a very high current control deviation very briefly, for example only for one sampling step, which then falls to a considerably lower value again. Such a behavior may be a behavior which does not indicate network isolation or the formation of a separate network and in this respect represents a behavior which does not constitute a deviation of the current control deviation from the predetermined reference range. In other words, this current profile explained by way of example and having a brief high current value can be in the reference range.

In this manner, further profiles of current control deviations can also form a profile which does not indicate network isolation or the formation of a separate network. Many different current profiles may therefore be in the reference range and, as a result, may form the reference range in their entirety.

In order to check for a deviation from the reference range, it is therefore also considered that a detected current control deviation and, for example, a temporal normalized profile form the checking function. This checking function can then be compared with a plurality of reference functions. If this checking function exceeds a reference function, in which case undershooting also comes into consideration depending on the consideration, this means only that the received checking function does not match the examined reference function. However, if another function, under which this checking function falls, is found, the reference function, and therefore, as a result, the current control deviation, is in the predetermined reference range.

One embodiment proposes that the predetermined reference range is predefined or changed on the basis of an operating mode or operating state of the generation unit, in particular the feed controller. If the wind power installation is therefore in a normal operating mode in which there is feeding without any peculiarities, it is possible to predefine a corresponding reference function which represents an accordingly normal reference range.

If the wind power installation then changes to a support mode by virtue of an instantaneous reserve power briefly being provided, for example, by virtue of more power being briefly fed into the electrical supply network than is possible on account of the currently prevailing wind, or more than the nominal power, a higher current control deviation can also be expected, for example. This is also due, in particular, to the high dynamic response of such network support by providing an instantaneous reserve power. Accordingly, the reference range or the reference variable or reference function can then be adapted. In other words, depending on the operating mode of the wind power installation, a different control current deviation may result in the assessment that there is network isolation or the formation of a separate network.

In this embodiment, the relevant reference range would therefore be selected or adapted or a corresponding reference variable or reference function would be selected or adapted depending on the operating mode. Another variant would be to establish corresponding reference ranges or reference variables or reference functions for different operating modes and to then check the checking variable or checking function for each of these reference ranges.

A difference between a desired value and an actual value or a desired current component and an actual current component of a current to be fed in is preferably used as the current control deviation. The current to be fed in and its control deviation are therefore considered here, in particular. A three-phase current is usually generated and a desired/actual value comparison is also carried out for each phase and a current control deviation is therefore considered for each phase. In this respect, a phase can be a current component of the current to be fed in. In this case, only the current control deviation of one phase may be considered, for example, or a current control deviation for each phase can be considered. The practice of combining the current control deviation also comes into consideration. The practice of using desired/actual value comparisons for transformed variables also comes into consideration. A transformation into a positive phase-sequence system and a negative phase-sequence system comes into consideration, in particular, in which case a desired/actual value comparison for the positive phase-sequence system component is then preferably proposed. A transformation into d and q components also comes into consideration and it is proposed for this purpose to carry out a desired/actual value comparison for both components, namely each individually. Moreover, these transformed variables can also be understood as meaning checking variables or checking functions.

Another configuration proposes that a deviation of the current control deviation from the reference range is present when the current control deviation, checking variable or checking function exceeds a predefined limit value in terms of absolute value, the current control deviation, checking variable or checking function leaves a predefined normal band, or the current control deviation, checking variable or checking function changes with a temporal gradient, the absolute value of which exceeds a predefined limit gradient.

In a simple case, it is therefore proposed to consider only the absolute value and to compare it with a predefined limit value. A check of the absolute magnitude of the current control deviation is therefore proposed.

Instead of using an absolute value, it is also possible to predefine a band, and a deviation is present when this band is left in the upward or downward direction or, in the case of a function, in the upward and downward direction. As a result, it is also possible to predefine an upper limit and a lower limit with different values.

When considering a temporal gradient, a dynamic behavior is considered, in particular. As a result, it is possible, if appropriate, to detect particularly quickly if the current control deviation leaves the reference range. However, the practice of combining these checking criteria also comes into consideration. One combination possibility involves assuming a deviation of the current control deviation from the reference range if one of a plurality of criteria identifies a deviation.

One embodiment proposes that the electrical supply network is fed by means of a three-phase feed current and the latter is composed of three phase currents. In this case, a desired current value is predefined for each phase current. For this purpose, it is proposed that the current control deviation takes into account a deviation of each phase current from its desired value. Three current control deviations therefore always arise. The deviations of the instantaneous values are considered here, in particular.

For this purpose, it is proposed in particular that the current control deviation, which is specifically used to check whether there is network isolation or the formation of a separate network, is formed, according to a vector metric, from absolute values of the deviations of each phase current from its desired current value. Each phase current, desired current value and also the respective deviation between them can each be described as a vector, possibly in a time-variant manner. Such a consideration can be referred to as a vector metric, in particular. It is proposed here to consider deviations of each phase current from its desired current value on the basis thereof. The deviations can hereby be described as vectors, in particular, and the absolute values thereof can be considered.

The sum of such absolute values is preferably considered as the current control deviation. For this purpose, it is proposed that network isolation or the formation of a separate network is identified if the current control deviation detected in this manner, that is to say in particular the sum of the absolute values, exceeds a deviation limit value. As a result, all three phases of the feed current can be taken into account in a simple manner.

One embodiment proposes that an absolute value of the current control deviation, checking variable or checking function is related to a tolerance bandwidth, in particular an average tolerance bandwidth. For this purpose, it is proposed, in particular, that network isolation is identified if the ratio of the absolute value of the deviation or of the deviation sum to the tolerance bandwidth exceeds the deviation limit value.

Network isolation is assumed, in particular, if the absolute value of the deviation is greater than the tolerance bandwidth by a multiple. Network isolation can then be assumed because the underlying tolerance band method could not correct the control deviation to some extent and, in particular as a result, this very high control deviation was exceeded by a multiple of the tolerance bandwidth. In the case of a tolerance band method, a deviation of the desired current from the upper band limit can be assumed in this case as a control deviation if the upper band limit is exceeded and a deviation from the lower band limit can be assumed if the latter is undershot. Alternatively, the practice of taking a current control deviation with respect to a desired value profile within the tolerance band as a basis for assessing the current control deviation alternatively comes into consideration. An alternative embodiment proposes that a three-phase feed current is fed into the electrical supply network, in particular by predefining current components by means of vector control, wherein, in order to control the feed, the three-phase feed current is broken down into a d component and a q component by means of a d-q transformation. For this purpose, it is proposed to use a difference between a desired value and an actual value of the d component and/or of the q component as the current control deviation.

Another embodiment proposes that the identification of network isolation or the formation of a separate network by detecting a deviation from the predetermined reference range is interpreted as identification of a first-degree separate network fault. For this purpose, it is then proposed that the generation unit is operated further after a first-degree separate network fault has been identified. In particular, the generation unit is operated further with a desired current value of zero.

For this purpose, it is preferably also proposed that the presence of a second-degree separate network fault is then checked, and the presence of a second-degree separate network fault is then assumed if a current control deviation is still identified even though a desired current value having the value zero is present in the feed controller. It has therefore been identified that a second-degree separate network fault is present when the generation unit does not manage to also actually comply with the desired current value having the value zero. Accordingly, there is a major exceptional fault, namely a second-degree separate network fault, in the case of which the resulting separate network fundamentally imposes a current, whether now positive or negative, on the generation unit. Precisely this situation is preferably checked here.

Another embodiment proposes that, after a first-degree separate network fault has been identified, the generation unit remains connected to the electrical supply network or to the separate network, and, after a second-degree separate network fault has been identified, the generation unit is isolated from the electrical supply network or the separate network or farm network. DC isolation is proposed here, in particular. However, the isolation can also be carried out using corresponding power semiconductors. A check for a second-degree separate network fault is therefore not only advantageously carried out in a second step, but rather a further safety measure is also proposed if such a second-degree separate network fault is identified. In particular, the method is implemented in the generation unit in such a manner that the method carries out the proposed steps in quick succession and therefore also carries out this isolation in the event of the second-degree separate network fault very quickly if necessary.

The invention also proposes a generation unit, in particular a wind power installation. The latter comprises at least one or more converters or inverters for feeding electrical power into the electrical supply network. Whether a converter or an inverter is used depends on the specific configuration of the generation unit, in particular of the wind power installation. The important factor is that the generation unit is not constructed in such a manner that it feeds in power via a synchronous generator directly coupled to the network, but rather via a converter or an inverter unit.

A feed controller is also provided and is prepared to control the feed by means of at least current control. Such current control is therefore implemented in the feed controller, in particular. Corresponding ammeter or measuring device or means are also present and carry out the corresponding current measurement for the current control.

A detection device or means is also provided for detecting at least one current control deviation of the control device. The current control deviation is therefore used not only for the current control of the feed controller but also for the further check. In this respect, the detection means may also be formed by receiving the current control deviation as a signal from the feed controller. In particular, the detection means can also be provided as a software solution. A further evaluation of the current control deviation in the feed controller also comes into consideration. In this case, the detection means would be a corresponding evaluation block in the software.

A checking device or means is also provided for checking the detected current control deviation for a deviation from a predetermined reference range. This checking means can also be formed as a checking block in software. It may also be implemented inside the feed controller.

In this case, the installation controller is prepared to identify network isolation if a deviation from the predetermined reference range has been detected. In this case, the network isolation is that in which a separate network which is isolated from the electrical supply network is produced, namely that network to which the generation unit is connected.

Provision is particularly preferably made for the generation unit, in particular a wind power installation, to be characterized in that it is prepared to carry out a method according to at least one of the embodiments described above.

The invention also proposes a wind farm having a plurality of wind power installations. At least one of the wind power installations, preferably all of these wind power installations, is/are each a generation unit or wind power installation according to an embodiment described above. The particular advantage of such a wind farm is that it can form the separate network or can form a significant part of such a separate network in the event of network isolation. However, the detection of such network isolation and the proposed taking of measures can therefore result in protection of the wind power installations or else in protection of the wind farm overall. It is therefore advantageous to equip a wind farm with those wind power installations which can detect such isolation or formation of a separate network.

BRIEF DESCRIPTION OF THE SEVERAL VIEWS OF THE DRAWINGS

The invention is explained in more detail below on the basis of exemplary embodiments with reference to the accompanying figures.

DETAILED DESCRIPTION

Figure 1:
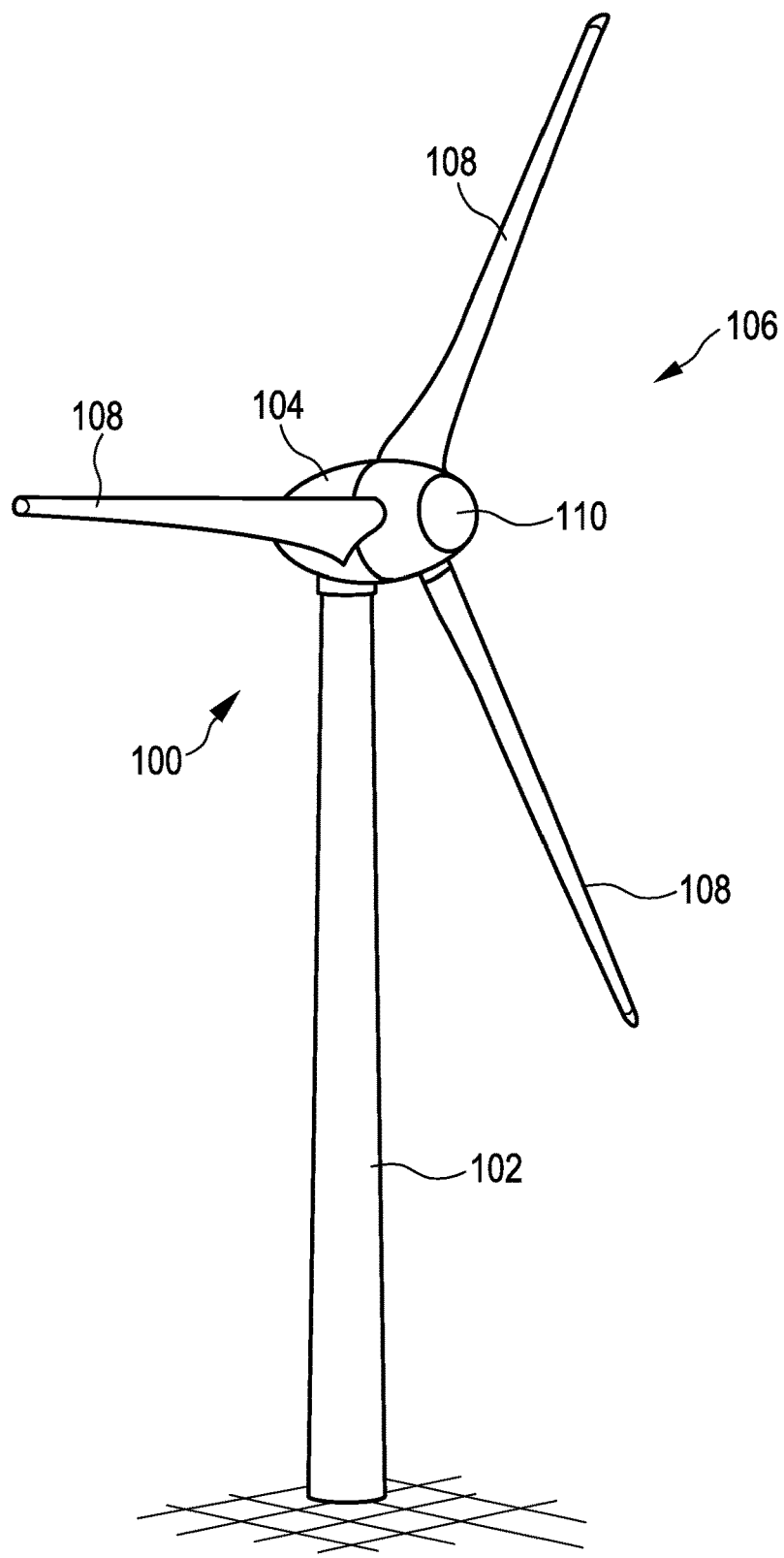
FIG. 1 shows a perspective illustration of a wind power installation.

FIG. 1 shows a wind power installation 100 having a tower 102 and a nacelle 104. A rotor 106 having three rotor blades 108 and a spinner 110 is arranged on the nacelle 104. The rotor 106 is caused to rotate by the wind during operation and thereby drives a generator in the nacelle 104.

Figure 2:
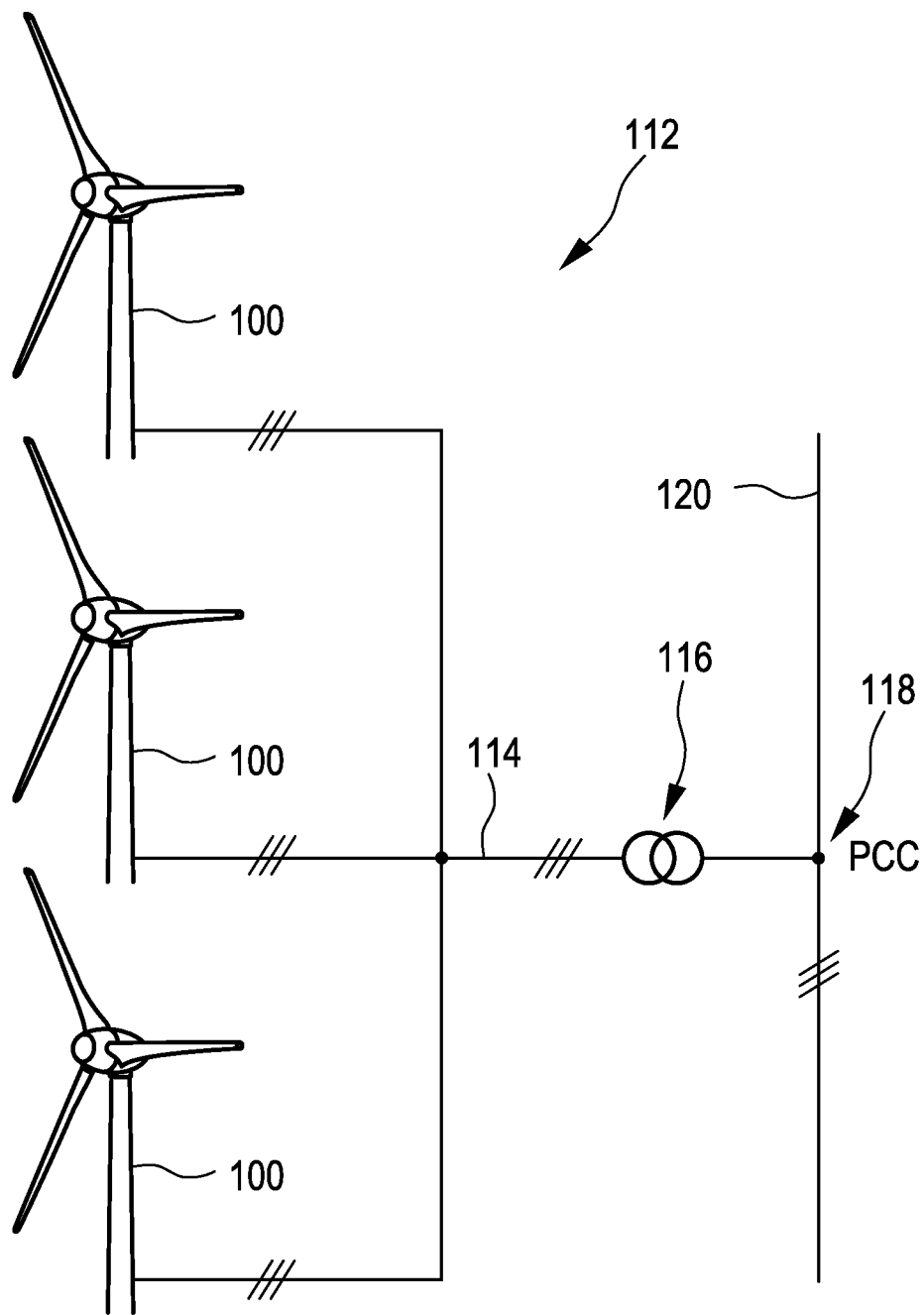
FIG. 2 shows a schematic illustration of a wind farm.

FIG. 2 shows a wind farm 112 having, by way of example, three wind power installations 100 which may be identical or different. The three wind power installations 100 are therefore representative of fundamentally any desired number of wind power installations in a wind farm 112. The wind power installations 100 provide their power, namely the generated current in particular, via an electrical farm network 114. In this case, the respectively generated currents or powers from the individual wind power installations 100 are added and a transformer 116 is usually provided and steps up the voltage in the farm in order to then feed it into the supply network 120 at the feed-in point 118 which is also generally referred to as the PCC. FIG. 2 is only a simplified illustration of a wind farm 112 which does not show a controller, for example, even though a controller is naturally present. The farm network 114 can also be configured differently, for example, by virtue of a transformer, for example, also being present at the output of each wind power installation 100, to name just one other exemplary embodiment.

Figure 3:
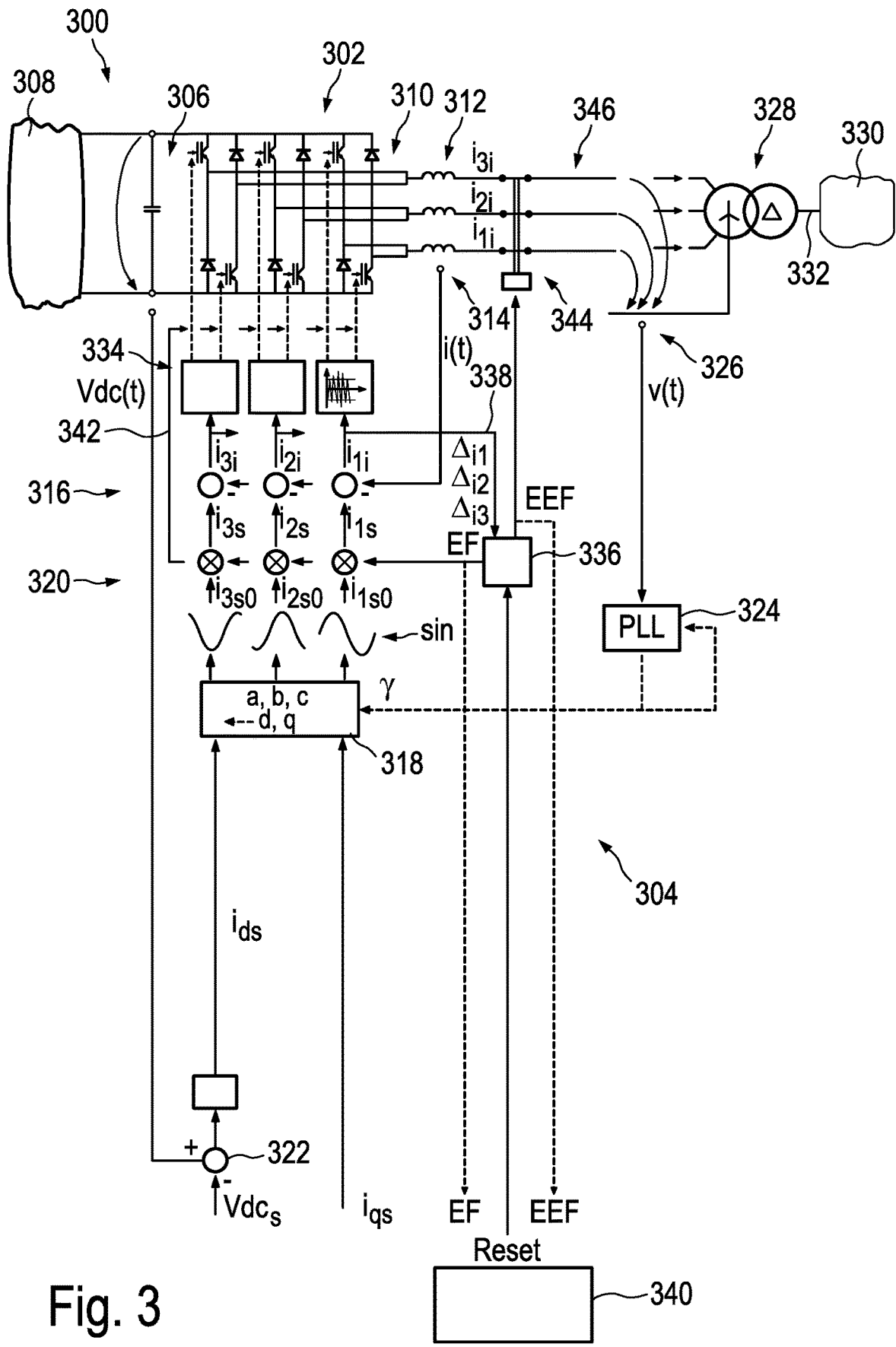
FIG. 3 schematically shows a part of a generation unit having elements for illustrating the behavior in the event of the formation of a separate network according to one embodiment.

FIG. 3 shows a part of a generation unit 300, namely an inverter 302 in particular, having an installation controller 304 which comprises elements for measurement, evaluation and control of the inverter 302.

The inverter 302 has a DC voltage intermediate circuit 306 which receives power or energy from a generator part 308 of the generation unit 300. The generator part 308 is indicated only schematically here and may represent, for example, a generator of a wind power installation with a downstream rectifier. The DC voltage intermediate circuit 306 therefore receives its power or energy from the generator part 308 and, on the basis of this, the inverter 302 can generate a three-phase output current at the inverter output 310. This output current is output via the network inductors or three-phase network inductor 312 and can also be detected there as an output current i(t) in the region of the three-phase network inductor 312 using a current measuring device 314. In this respect, this output current i(t) is representative of the entire three-phase current or representative of a measurement of a phase current of each of the phases.

A desired/actual value comparison is respectively carried out for each of these phase currents i(t) between the detected actual current which was detected using the current measuring device 314 and a desired current in the current comparator 316. For better explanation, the currents $i_{1i}$, $i_{2i}$ and $i_{3i}$ are depicted there as actual currents of the individual phases in the form of actual values which are subtracted from the respective desired current $i_{1s}$, $i_{2s}$, and $i_{3s}$.

The desired currents $i_{1s}$, $i_{2s}$, and $i_{3s}$ are predefined for each phase in the transformation block 318. This is also intended to be illustrated using the indicated sine waves sin which are illustrated at different phase angles.

A multiplier arrangement 320 is arranged upstream of the current comparator 316, which multiplier arrangement is provided for the purpose of considering the case of the formation of a separate network and only then becomes relevant. As long as no formation of a separate network has been detected and, in particular, there is therefore also no separate network fault, the multipliers each receive the value 1 as a fault signal EF, with the result that the desired current values output by the transformation block 318 reach the respective comparator 316 without change.

The transformation block 318 receives, as input variables, desired current values in d-q coordinates, namely the desired value $i_{ds}$ and the desired value $i_{qs}$. In this case, the desired current component $i_{qs}$ is substantially immediately predefined. The desired current component $i_{ds}$ also takes into account a desired/actual value comparison by the voltage comparator 322 which forms a desired/actual value difference between the voltage Vdc detected at the DC voltage intermediate circuit 306 and a predefined voltage Vdcs.

The transformation block 318 also takes into account a transformation angle γ which is determined from a measured output voltage v(t) by a PLL controller 324. The output voltage v(t) is detected by means of a voltage measuring device 326, for example in the region between the three-phase network inductor 312 and a network transformer 328. Moreover, the network transformer 328 is then connected to the indicated network 330 in the depicted illustration in FIG. 3. The network 330 can be the electrical supply network, and the network connection point 332 may be between the network transformer 328 and the indicated network 330.

In order to control the feed, the current control deviations $\Delta_{i1}$, $\Delta_{i2}$ and $\Delta_{i3}$, that is to say the outputs of each comparator 316, are supplied to the control blocks 334. The control blocks 334 each control corresponding semiconductor switches in the inverter 302 in order to generate the output currents $i_{1i}$, $i_{2i}$ and $i_{3i}$ from the DC voltage in the DC voltage intermediate circuit 306. Moreover, the control blocks 334 together form a feed controller. In this case, the comparators 316 and possibly a desired value specification, in particular the transformation block 318, can be included in the feed controller.

The current control deviations $\Delta_{i1}$, $\Delta_{i2}$ and $\Delta_{i3}$ are also input to the checking block 336 which therefore forms the checking means. This checking means or the checking block 336 checks whether the current control deviation differs from a predetermined reference range. In this respect, the symbolic data supply 338 can also be considered to be a detection means for detecting the current control deviations. The current control deviations are formed in the current comparators 316 for the purpose of controlling the feed, but their forwarding to the checking block 336 is a further detection in this respect.

In the checking block 336, a check is therefore now carried out in order to determine whether this current control deviation or these current control deviations $\Delta_{i1}$, $\Delta_{i2}$ and $\Delta_{i3}$ differ(s) from a predetermined reference range. In the simplest case, a check of the absolute values of these three differential currents $\Delta_{i1}$, $\Delta_{i2}$ and $\Delta_{i3}$ with a limit value comes into consideration here. For this purpose, an average value of their absolute values can be formed, for example, and can be compared with a corresponding limit value, or their absolute values are added and this sum is compared with an absolute limit value.

If it emerges in this case that there is network isolation and therefore the formation of a separate network, the fault signal EF is output. This fault signal EF can be passed to a further evaluation or control block 340. This evaluation and control block can also involve, for example, informing the network operator or the installation operator or a farm operator of the identified fault. Provision is also made for the fault signal EF to be passed to the multiplier arrangement 320 in order to be multiplied there by the desired currents $i_{1s0}$, $i_{2s0}$ and $i_{3s0}$. For this purpose, this fault signal can be designed in such a manner that it assumes the value zero in the event of a fault. The three desired currents $i_{1s}$, $i_{2s}$ and $i_{3s}$ would therefore then have the value zero. However, this use of the multiplier arrangement 320 should be understood symbolically, in particular, and various other implementations come into consideration, for example the practice of already considering the fault signal in the transformation block 318.

A fault forwarding device 342 is likewise shown in an illustrative manner and is intended to indicate that the fault signal can also have a direct effect on the control values which are output by the control blocks 334. The intention is to illustrate here, in particular, that a reaction or measure which is as fast and direct as possible is proposed.

The result is therefore that a desired current value of zero is predefined or a desired current value of zero is predefined three times for each phase. If a current having the value zero is also actually substantially then detected using the current measuring device 314, the generation unit 300 can also still remain connected, that is to say can also be connected to the network 330 via the network transformer 328 and the network connection point 332, in particular.

However, if it is detected that the output current i(t) or the three phase currents $i_{1i}$, $i_{2i}$ and $i_{3i}$ is/are not zero, in particular if it is detected that said currents have a very high value, this can likewise be identified in the checking block 336. In particular, the fact that such monitoring is carried out is implemented in the checking block 336. Such a current behavior is therefore monitored in the checking block 336, in particular after the formation of a separate network. In this respect, the detection of the formation of a separate network, as previously described with respect to FIG. 3, is also the detection of a first-degree separate network fault.

If, after this first-degree separate network fault has been detected and the desired current value(s) has/have been set to zero, a current is now still detected, in particular a high output current, possibly also with a negative sign, this can be detected in the checking block 336 as a second-degree separate network fault. In this respect, the special fault signal EEF is output. This special fault signal EEF can also be supplied to the evaluation and control block 340 in order to communicate it to an installation, farm or network operator, for example. It is also proposed in this case that, if this second-degree separate network fault is identified, the isolating switch 344 provided is immediately controlled by the checking block 336, namely in such a manner that it opens.

The generation unit 300, and therefore its inverter 302, is therefore isolated from the rest of the network. In this case, the network isolation is carried out as close as possible to the generation unit 300 or the inverter 302, namely here directly downstream of the network inductor 312. This may mean, for example, isolation from a wind farm network 346 which is only indicated here and, in this respect, also assumes that the generation unit 300 is a wind power installation.

Network isolation or the formation of a separate network can therefore now be detected in a simple manner by monitoring the current control deviation, namely, in particular, the differential currents $\Delta_{i1}$, $\Delta_{i2}$ and $\Delta_{i3}$. It is particularly advantageous in this case that immediate evaluation of the voltage in the wind farm 346, in particular, is not required. This also takes into account the knowledge, in particular, that the voltage detected in the wind farm 346, in particular by means of the voltage measuring means 326, may be a very inaccurate criterion. Voltage peaks, excessive voltage increases or else frequency changes from a normal state may occur, in principle. Such deviations may also sometimes assume large values, but without this meaning that there is network isolation or the formation of a separate network. However, such network isolation or the formation of a separate network can be reliably identified by monitoring or evaluating the current control deviation because the installation behavior, namely the behavior of this current control deviation, is fundamentally known. If a current control deviation which leaves the predetermined reference range now occurs, this is a reliable indication of network isolation or the formation of a separate network, at least when the reference range comprises all behaviors which cannot be assigned to network isolation or the formation of a separate network.

In this case, it was also identified that the current control already takes into account the overall behavior of the network, that is to say including voltage and frequency changes, as well as necessary supporting reactions by the generation unit.

It is likewise possible to immediately react to such network formation in a simple manner by means of the proposed solution, and, by setting the desired current value to the value zero in the proposed manner, the formation of a separate network is also taken into account and no further current is fed in and the generation unit is nevertheless changed to a standby state from which it could be involved in network support again as quickly as possible.

Figure 4:
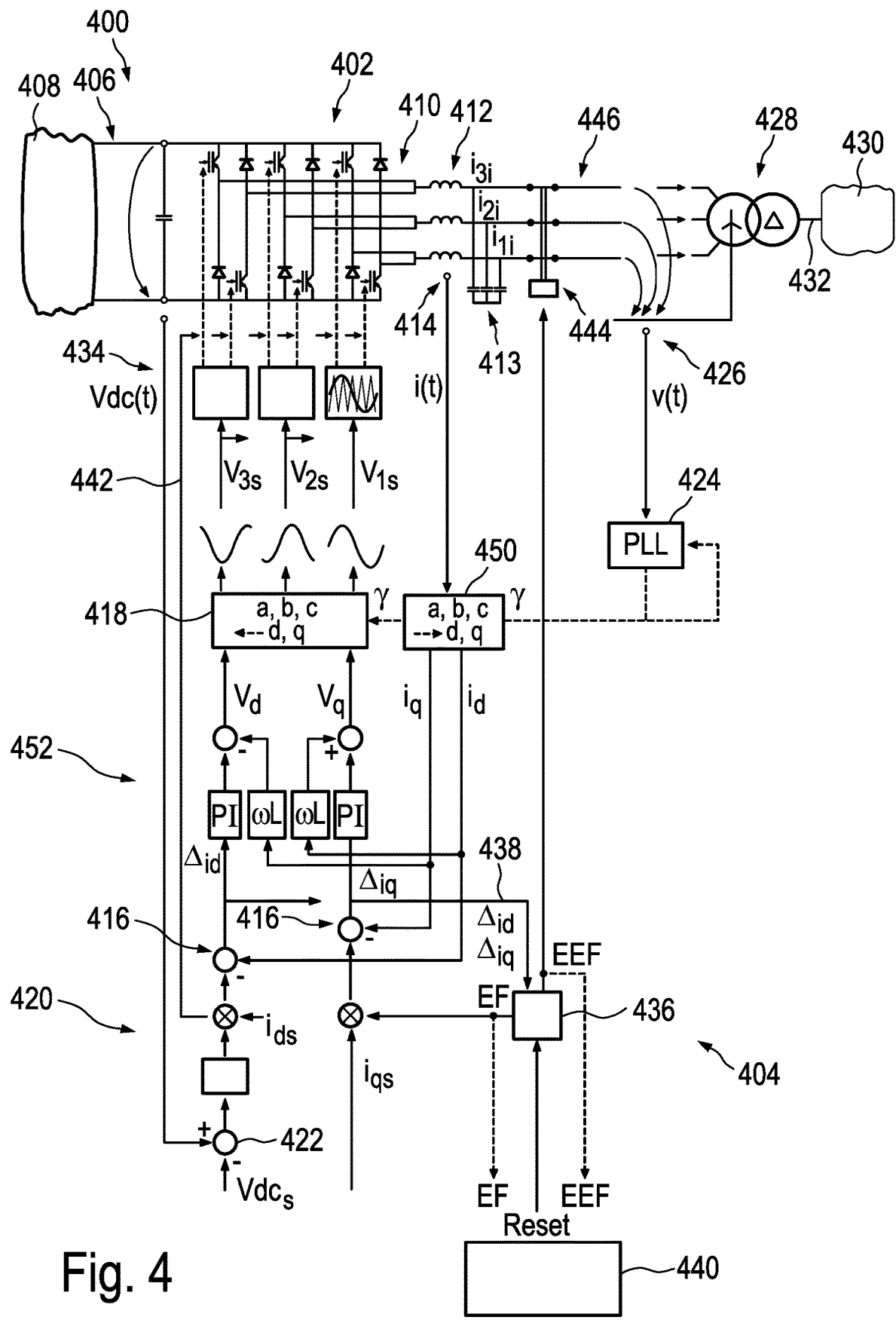
FIG. 4 schematically shows a part of a generation unit together with elements for illustrating the behavior in the event of the formation of a separate network according to a second embodiment.

FIG. 4 shows, in a very similar manner to the embodiment in FIG. 3, a generation unit 400, or a part of the latter, having an inverter 402 and an installation controller 404. Provision is also made of a DC voltage intermediate circuit 406 which is supplied by a generator part 408 and provides power for the inverter 402 so that the latter provides an output current i(t) or the three phase currents $i_{1i}$, $i_{2i}$, $i_{3i}$ at the inverter output 410, in which case a three-phase network inductor 412 is also present. A network filter 413 is also indicated here.

The embodiment in FIG. 4 also shows a farm network 446, a network transformer 428, a network 430 and, upstream of the latter, a network connection point 432.

In order to control the feed, an arrangement of a plurality of control blocks 434 is likewise provided. These control blocks may at least partially form the feed controller. Unlike in the embodiment in FIG. 3, however, voltage control or vector control is provided here. Triangular modulation is proposed here, in particular. For this purpose, the three-phase output current i(t) is detected using the current measuring device 414 and is transformed into a q component $i_q$ and a d component $i_d$ in a current transformation block 450.

The transformation angle γ required for this purpose is also determined here by means of a PLL controller 424 which uses a detected voltage v(t) from the voltage measuring device 426 (or voltmeter) as the input variable.

The components $i_q$ and $i_d$ which are transformed in the current transformation block 450 then each compared with a desired current component $i_{ds}$ and $i_{qs}$ in a current comparator arrangement 416. The calculation is carried out in a very similar manner to that in the embodiment in FIG. 3 and the current component $i_{ds}$, in particular, is also compared with the voltages Vdc(t) and Vdcs by means of a voltage comparator 422.

The two differential current components $\Delta_{id}$ and $\Delta_{iq}$ emerge as the result in the comparison by the current comparators 416. These two differential current components $\Delta_{id}$ and $\Delta_{iq}$ therefore form the control current deviation and the latter is supplied to the checking block 436 via the data supply 438.

These two differential current components $\Delta_{id}$ and $\Delta_{iq}$ are also converted, in a voltage specification arrangement 452, into the two desired voltage components Vd and Vq which are in turn converted, in the transformation block 418, into three voltage profiles, namely one voltage profile for each phase in each case. These three predefined voltage profiles $V_{1s}$, $V_{2s}$ and $V_{3s}$ are then finally converted into control signals for the inverter 402 in the control blocks 434.

Feeding by means of current control is therefore also present here. This current control namely carries out a desired/actual value comparison between desired currents and actual currents. However, the variant in FIG. 4 uses the transformed current components $i_d$ and $i_q$ or $i_d$, and $i_{qs}$. The result is a current control deviation, namely the differential current components $\Delta_{id}$ and $\Delta_{iq}$. These are needed for feeding but are also detected for the purpose of detecting network isolation or the formation of a separate network. The data supply 438 can therefore also be understood here as meaning a detection device which detects this current control deviation from the feed controller and supplies it to the checking block 436.

The checking block 436, which therefore constitutes a checking device, then first of all checks for network isolation or the formation of a separate network and therefore for a first-degree separate network fault. If such a first-degree separate network fault is identified, the fault signal EF is also output here. For the sake of simplicity, this fault signal EF is denoted in exactly the same manner as in the embodiment in FIG. 3, but may differ in terms of its values. However, it preferably does not differ and has the value zero or one. If it has the value one, this means that there is no fault, that is to say no network isolation or the formation of a separate network has been detected. This then also results in this value one not having an effect in the multiplier arrangement 420, that is to say does not change the desired current components $i_{ds}$ and $i_{qs}$ arriving there on account of the multiplication by one. However, if a first-degree network fault is identified, this fault signal EF can assume the value zero. This results in the desired current components being set to the value zero. Like in the embodiment in FIG. 3, a direct and immediate effect on control signals from the control blocks 434 for controlling the inverter 402 is also indicated here via the symbolically illustrated fault forwarding 442.

This identification of a first-degree separate network fault therefore also results in the reaction that the desired currents are set to the value zero. At the same time, the fault signal EF can be supplied to the evaluation and control block 440 in order to thereby also communicate this information further, for example, and to use it not only for the control.

If such a first-degree separate network fault has now been identified, the checking block 436 continues the check and checks whether a second-degree separate network fault also occurs. This is also carried out on the basis of the detected current control deviation which is also supplied to the checking block 436 by means of the data supply 438. If a second-degree separate network fault is identified in this case, the isolating switch 444 is actuated, namely opened, and the inverter 402 is therefore isolated from the farm network 446. This special fault EEF is also supplied to the evaluation and control block 440.

If a first-degree separate network fault is therefore identified, the inverter 402 is operated further and is not isolated, but also does not feed in any current. If a current is nevertheless identified, in particular a current which has a high value and cannot be explained by the control of the inverter 402, a second-degree separate network fault is assumed and the isolating switch 444 is opened.

If the fault has now been eliminated, if the formation of a separate network has ended, in particular, or can be ended soon, the evaluation and control block 440 can also be used to pass a reset signal to the checking block 436. As a result, the isolating switch 444 can then be closed again, if necessary, and the fault signal EF can also assume the value one again and, as a result, the desired current can leave the value zero again. The situation in which only a first-degree separate network fault has been identified and the isolating switch 444 has not been opened also comes into consideration. However, the evaluation and control block 440 can then also pass a reset signal to the checking block 436 in order to at least set the fault signal EF to a value again which shows that there is no fault, in particular namely to the value one.

Moreover, this functionality of passing a reset signal from the evaluation and control block 440 to the checking block 436 also applies, in the same manner described, to the embodiment in FIG. 3, according to which the evaluation and control block 340 there can pass a reset signal to the checking block 336.

The invention claimed is:

1. A method for controlling a generation unit that feeds an electrical supply network using one or more converters or inverters and for detecting network isolation or formation of a separate network, comprising:
   controlling, by a feed controller that operates at least using current control, feeding the electrical supply network;
   detecting current control deviation;
   determining whether the detected current control deviation deviates from a predetermined reference range, wherein determining whether the detected current control deviation deviates from the predetermined reference range includes:
      identifying a checking variable or checking function from the current control deviation; and
      comparing the checking variable or checking function with at least one reference variable or reference function; and
   if the detected current control deviation deviates from the predetermined reference range, identifying the network isolation in the case of which the separate network is formed, the separate network being separated from the electrical supply network and connected to the generation unit.

2. The method as claimed in claim 1, wherein the separate network is a network to which only the generation unit and one or more further generation units are connected and wherein no generation units with a directly coupled synchronous generator are connected to the separate network.

3. A method for controlling a generation unit that feeds an electrical supply network using one or more converters or inverters, comprising:
   determining whether a first-degree separate network fault is present by:
      detecting current control deviation; and
      determining whether the detected current control deviation deviates from a predetermined reference range, wherein determining whether the detected current control deviation deviates from the predetermined reference range includes:
         identifying a checking variable or checking function from the current control deviation; and
         comparing the checking variable or checking function with at least one reference variable or reference function;
   if the first-degree separate network fault is present, determining whether a second-degree separate network fault is present; and
   identifying network isolation in the case of which a separate network is produced, the separate network being separated from the electrical supply network and the generation unit being connected to the separate network.

4. The method as claimed in claim 3, comprising:
   if the first-degree separate network fault is present, setting a desired current value, for which the current control deviation is detected, to zero, and
   if the second-degree separate network fault is present:
      opening a circuit breaker; and
      interrupting a current on which the current control deviation is based.

5. The method as claimed in claim 1, comprising:
   defining or changing the predetermined reference range based on an operating mode or operating state of the generation unit or the feed controller.

6. The method as claimed in claim 1, comprising:
   setting the current control deviation to a difference between a desired current and an actual current or a desired current component and an actual current component of a current to be fed in.

7. The method as claimed in claim 1, comprising determining that the detected current control deviation deviates from the predetermined reference range when:
   an absolute value of the checking variable or the checking function exceeds a predefined limit value,
   the checking variable or the checking function leaves a predefined normal band, or
   the checking variable or the checking function changes with a temporal gradient having an absolute value that exceeds a predefined limit gradient.

8. The method as claimed in claim 1, comprising:
   feeding the electrical supply network using a three-phase feed current composed of three phase currents, wherein a desired current value is predefined for each phase current of the three-phase feed current; and
   determining whether the detected current control deviation deviates from the predetermined reference range by determining whether each phase current deviates from the desired current value of the respective phase.

9. The method as claimed in claim 1, wherein an absolute value of the current control deviation, the checking variable or the checking function is related to a tolerance bandwidth or an average tolerance bandwidth.

10. The method as claimed in claim 1, comprising:
feeding a three-phase feed current into the electrical supply network by predefining current components using vector control,
dividing the three-phase feed current into a d component and a q component using a d-q transformation, and
setting the current control deviation to a difference between a desired value and an actual value of the d component or the q component.

11. The method as claimed in claim 1, comprising:
interpreting the identification of the network isolation or the formation of the separate network by detecting the deviation from the predetermined reference range as an identification of a first-degree separate network fault; and
further operating the generation unit after identifying the first-degree separate network fault.

12. The method as claimed in claim 11, wherein
after identifying the first-degree separate network fault,
further operating the generation unit with a desired current value set to zero;
checking for a presence of a second-degree separate network fault; and
determining that the second-degree separate network fault is present if the current control deviation is identified though the desired current value in the feed controller is zero.

13. The method as claimed in claim 1, comprising:
keeping the generation unit connected to the electrical supply network or to the separate network after a first-degree separate network fault is identified; and
isolating the generation unit in a DC fashion from the electrical supply network or the separate network after a second-degree separate network fault is identified.

14. A generation unit, comprising:
one or more converters or inverters configured to feed electrical power into an electrical supply network;
an installation controller configured to detect network isolation or a formation of a separate network;
a feed controller configured to control feeding the electrical power at least by current control;
a detection device configured to detect current control deviation; and
a checking device configured to check whether the detected current control deviation deviates from a predetermined reference range by at least:
identifying a checking variable or checking function from the current control deviation; and
comparing the checking variable or checking function with at least one reference variable or reference function,
wherein the installation controller is configured to, if the checking device detects the deviation from the predetermined reference range, identify the network isolation in the case of which the separate network is formed, the separate network being separated from the electrical supply network and the generation unit being connected to the separate network.

15. A wind farm having a plurality of wind power installations, wherein at least one of the plurality of wind power installations is the generation unit as claimed in claim 14.

16. The method as claimed in claim 8, comprising:
determining whether the detected current control deviation deviates from the predetermined reference range by determining, based on a vector metric, absolute values of deviations of each phase current from the respective desired current value or a sum of the absolute values of the deviations of each phase.

* * * * *